(12) United States Patent
Shioe

(10) Patent No.: US 7,091,789 B2
(45) Date of Patent: Aug. 15, 2006

(54) OUTPUT CIRCUIT

(75) Inventor: Hideki Shioe, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 89 days.

(21) Appl. No.: 10/811,426

(22) Filed: Mar. 26, 2004

(65) Prior Publication Data

US 2004/0189401 A1   Sep. 30, 2004

(30) Foreign Application Priority Data

Mar. 27, 2003   (JP)   ............................. 2003-087813

(51) Int. Cl.
*H03F 3/04* (2006.01)
*H03F 3/45* (2006.01)

(52) U.S. Cl. ...................... 330/296; 330/259; 330/260; 330/263

(58) Field of Classification Search ................ 330/296, 330/285, 261, 263, 259, 260
See application file for complete search history.

(56) References Cited

U.S. PATENT DOCUMENTS 6,175,277 B1 *  1/2001  Mavencamp ................. 330/264

FOREIGN PATENT DOCUMENTS

JP   9-51256   2/1997

* cited by examiner

*Primary Examiner*—Khanh Van Nguyen
(74) *Attorney, Agent, or Firm*—Morrison & Foerster LLP

(57) ABSTRACT

It is an object of the present invention to provide an output circuit capable of reducing a consumption current while an output current is suppressed in a case where limitation is placed on an output voltage so as not to fall to a predetermined voltage or less in an output circuit the emitter of which is grounded, the base of which serves as an input node for a control current and the collector of which serves as an output node. Provided are a base current supply section for supplying a base current to the output transistor according to an input signal from the outside, and a base current control section for detecting an inter-terminal voltage between the collector and emitter of the output transistor to control a base current supplied from the base current supply section so as not to cause the inter-terminal voltage to fall to a value lower than a predetermined voltage.

9 Claims, 9 Drawing Sheets

OUTPUT CIRCUIT

BACKGROUND OF THE INVENTION

1. Field of the Invention

The present invention relates to an output circuit in semiconductor integrated circuitry, and particularly, to an output circuit having an output transistor the emitter of which is grounded, the base of which serves as an input node for a control current and the collector of which serves as an output node.

2. Description of the Related Art

As a conventional example of an output circuit having an output transistor, there have been available, for example, an output circuit disclosed in JP-A 9-51256 (1997) or an output circuit shown in FIG. 8.

The circuit shown in FIG. 8 includes an output transistor Q1, other transistors Q2 to Q6, a current source I1 and a load X. To be detailed, the transistors Q2 and Q3 are connected between the emitters thereof, the base of the transistor Q2 serves as an input for an input signal VIN, the base of the transistor Q3 serves as an input for a reference voltage V1, and the current source I1 is connected between a power supply voltage VCC and the emitters of the transistors Q2 and Q3 in order to supply a current to the emitters thereof. The collector of the transistor Q4 is connected to the collector of the transistor Q2 and the emitter thereof is grounded, and the collector and base of the transistor Q5 are connected to the collector of the transistor Q3 and the base of the transistor Q4 and the emitter thereof is grounded. The collector of the output transistor Q1 is connected to an output VOUT, the base thereof is connected to a connecting point between the collector of the transistor Q2 and the collector of the transistor Q4 and the emitter thereof is grounded. The collector of the transistor Q6 is connected to the power supply voltage VCC, the base thereof is applied with a reference voltage V2 and the emitter thereof is connected to the output VOUT. The load X is connected between the output VOUT and the power supply voltage VCC.

Then, description will be given of operations in a conventional output circuit shown in FIG. 8. A current of the current source I1 is split into collector currents of the transistors Q2 and Q3 according to a voltage difference between the input signal VIN and a reference voltage V1. The collector current in the transistor Q3 becomes a collector current of the transistor Q4 by the action of a current mirror circuit constituted of the transistors Q4 and Q5. Since the collectors of the transistors Q2 and Q4 are connected to each other, a difference between the collector currents thereof is a base current of the transistor Q1 and a collector current $h_{fe}$ (an h parameter expressing a current amplification factor) times as large as the base current flows through the load X and the power supply voltage VCC drops by an inter-terminal voltage of the load X to obtain a potential at the output VOUT. In a case where the input signal VIN>the reference voltage V1, a collector current of the transistor Q4 is larger than that of the transistor Q2, so that a current is extracted from the base of the output transistor Q1 to reduce a current flowing into the load X and raise a voltage at the output VOUT. To the contrary, in a case where the input signal VIN<the reference voltage V1, a collector current of the transistor Q2 is larger than that of the transistor Q4, so that a base current flows into the base of the transistor Q1, a collector current $h_{fe}$ times as large as the base current flows through the load X to reduce a voltage at the output VOUT. In a case where the voltage at the output VOUT falls to a value lower than a voltage lower than the reference voltage V2 by $V_{BE}$, the transistor Q6 acts to limit falling of a voltage at the output VOUT so as not to be lower than a voltage lower than the reference voltage V2 by $V_{BE}$.

In the situation where a collector current of the output transistor Q1 increases, a voltage at the output VOUT falls and limitation is placed on falling of the voltage thereat by the transistor Q6, a current flowing through the collector of the transistor Q6, of a collector current of the output transistor Q1, for the limitation is useless since it does not contribute to a change in output voltage in response to the input signal VIN. Especially, in a case where a sharp change in an instant during which an output transitions is desired and the voltage after the change has only to be retained in value, a current necessary only for a period when an output voltage transitions continues to flow after the change in output voltage, having led to a fault to increase a consumption current.

SUMMARY OF THE INVENTION

The present invention has been made in light of the above problem and it is an object of the present invention to provide an output circuit capable of reducing a consumption current while an output current is suppressed in a case where limitation is placed on an output voltage so as not to fall to a predetermined voltage or less.

An output circuit in accordance with the present invention for achieving the object is configured as shown in FIG. 9, for example. The output circuit shown in FIG. 9 is of a configuration that the transistor Q6 is deleted from the conventional output circuit shown in FIG. 8 and, instead, a base current control section 1 is connected between the collectors of the transistors Q2 and Q4. Herein, a configuration is adopted in which the base current control section 1 detects an inter-terminal voltage between the collector and emitter of the transistor Q1, that is, an output voltage of the output circuit to control a base current supplied to the output transistor Q1 according to the input signal VIN from the outside so that the inter-terminal voltage does not fall to a value lower than a predetermined voltage V3.

In an output circuit in accordance with the present invention, a base current of the transistor Q1 is limited to thereby reduce a collector current of the transistor Q1 and suppress falling in the inter-terminal voltage between the collector and emitter of the output transistor Q1 in FIG. 9 as a means for causing the inter-terminal voltage not to fall to a value lower than the reference voltage V3; therefore, a collector current of the transistor Q1 when the limitation is placed on falling in the inter-terminal voltage is restricted to the lowest necessary limit.

As a result, the transistor Q6 that is conventionally used for output voltage compensation is not employed and the output voltage compensation can be effected with a collector current at the lowest necessary limit, and in a case where limitation is placed on an output voltage so as not to be equal to or less than a predetermined value, an output circuit can be provided that is capable of suppressing an output current to reduce a consumption current.

DETAILED DESCRIPTION OF THE INVENTION

Description will be given of an embodiment of an output circuit in accordance with the present invention (hereinafter, referred to as "a circuit of the present invention" when it is proper to refer so) based on the accompanying drawings. Note that the same symbols are attached to portions and sites in common to both the present invention and the prior art shown in FIG. 8. In the following examples as well, the same symbols are attached to portions and sites in common to those and the prior art shown in FIG. 8.

First Embodiment

Figure 1:
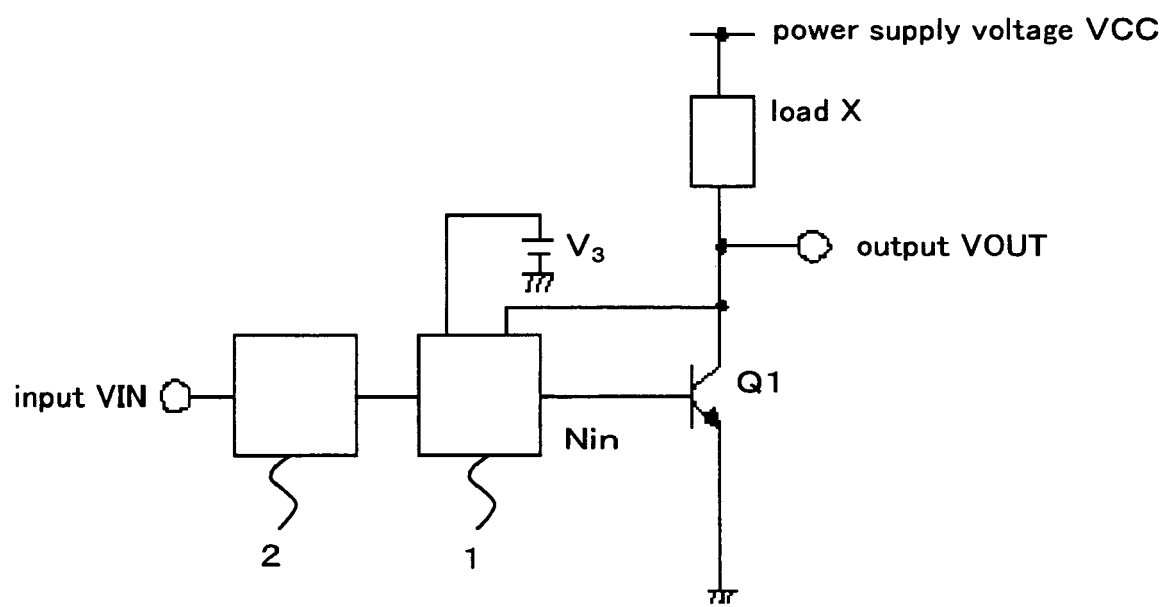
FIG. 1 is a block diagram showing a configuration of a first embodiment of an output circuit in accordance with the present invention.

FIG. 1 is a block diagram for describing a concept of configuration of a circuit of the present invention. As shown in FIG. 1, the circuit of the present invention includes an output transistor Q1 the emitter of which is grounded, the base of which serves as an input node Nin for a control current and the collector of which serves as an output VOUT (output node), a base current supply section 2 for supplying a base current to the output transistor Q1 according to an input signal VIN from the outside, and a base current control section 1 for detecting an inter-terminal voltage between the collector and emitter of the output transistor Q1 to control a base current supplied from the base current supply section 2 so as not to cause the inter-terminal voltage to be lower than a predetermined voltage, wherein a load X is connected between the output VOUT and a power supply voltage VCC.

Herein, the base current supply section 2 receives the input signal VIN to output a current corresponding thereto and examples thereof include an emitter grounded amplifier having a base as an input, a differential amplifier and the like.

The base current control section 1 compares an inter-terminal voltage between the collector and emitter of the output transistor Q1 with a reference voltage V3 to adjust a base current of the output transistor Q1 to a proper value. If the inter-terminal voltage of the output transistor Q1 is sufficiently larger than the reference voltage V3, a current supplied from the base current supply section 2 is supplied to the base of the output transistor Q1 with no change in the current while if the inter-terminal voltage is a value in the vicinity of the reference voltage V3, a supply of a base current is limited so as not to cause the inter-terminal voltage V3 to fall to a value lower than the reference voltage V3. This limitation works such that the base current is limited to a smaller value as the inter-terminal voltage between the collector and emitter of the output transistor Q1 is reduced to a value further lower than the reference voltage V3.

FIRST EXAMPLE

Figure 2:
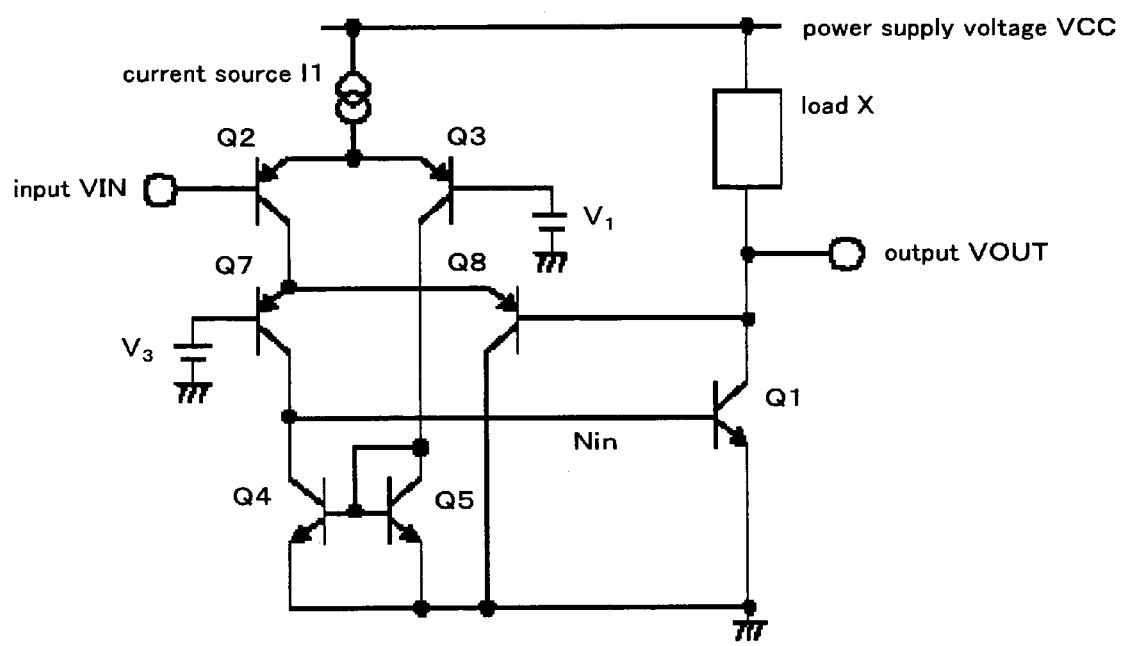
FIG. 2 is a circuit diagram showing a circuit configuration of a first example of the output circuit in accordance with the present invention.
Figure 8:
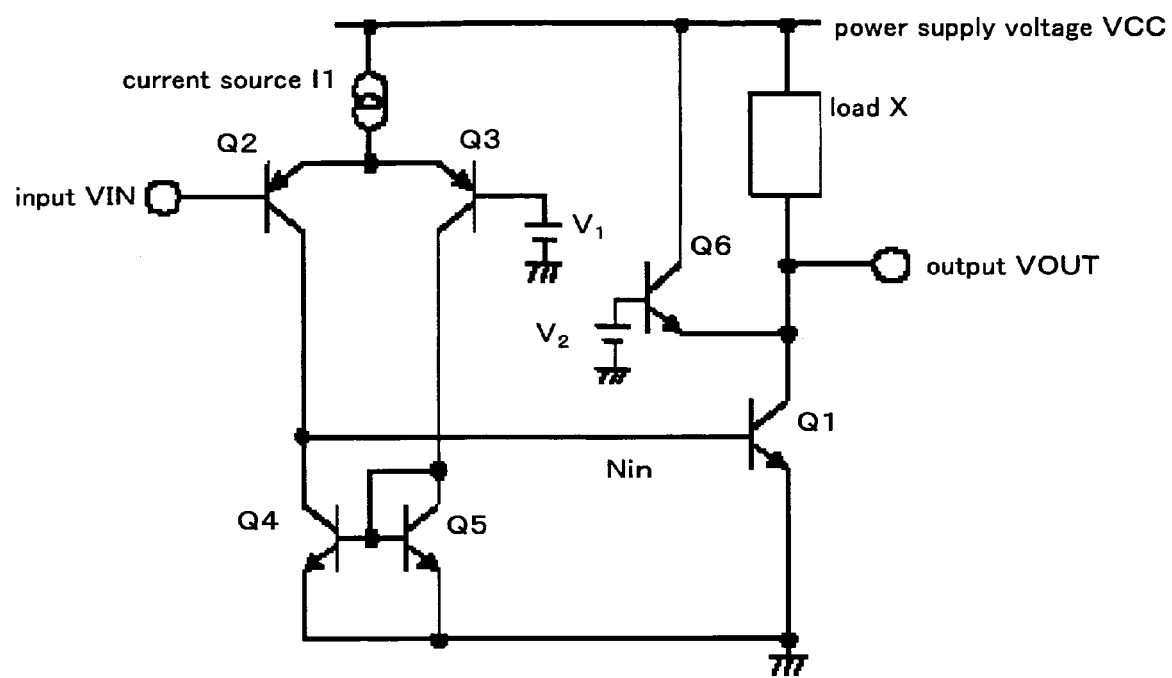
FIG. 8 is a circuit diagram showing an example of circuit configuration of a conventional output circuit.
Figure 9:
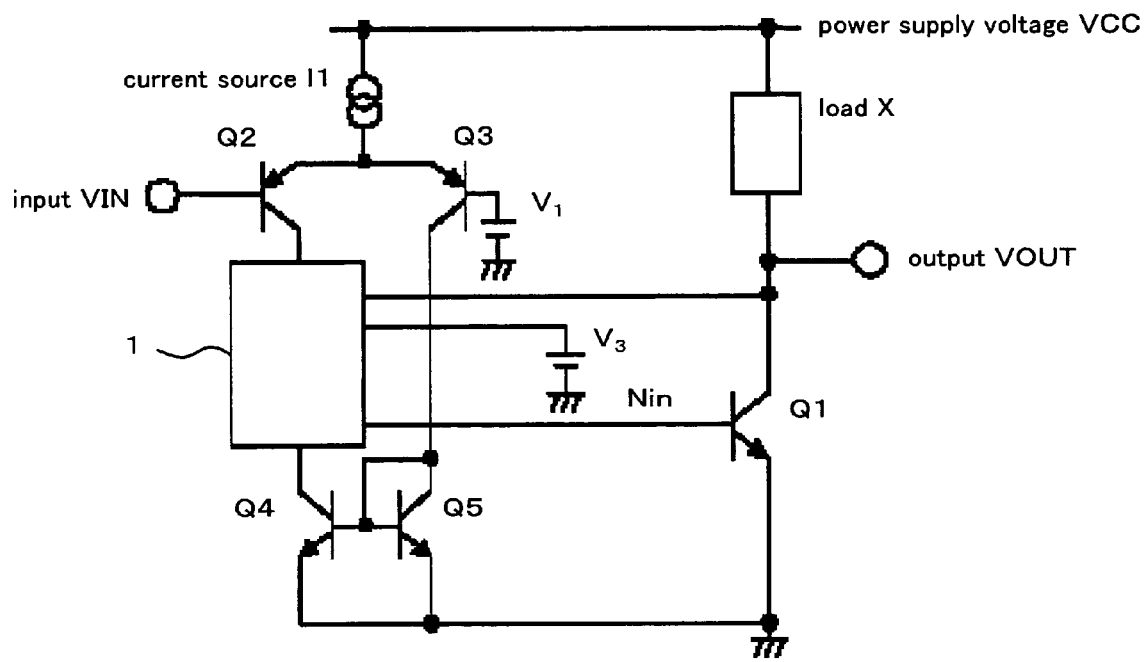
FIG. 9 is a diagram of a circuit configuration describing a basic concept of a circuit configuration of an output circuit in accordance with the present invention.

In FIG. 2, there is shown the first embodiment of the circuit of the present invention shown in the block diagram of FIG. 1, as a circuit diagram of a first example realized with a concrete transistor circuit. The circuit diagram of the first example is different from the conventional circuit of FIG. 8 in that the collector of a PNP transistor Q2 is not connected to the collector of a transistor Q4, but a comparator corresponding to the base current control section of FIG. 1 with an inter-terminal voltage between the collector and emitter of the output transistor Q1 and the reference voltage V3 as a differential input is inserted between the collector of the transistor Q2 and the collector of the transistor Q4 and that the transistor Q6 in FIG. 8 is deleted. The comparator includes a transistor Q7 the collector of which is connected to the collector of the transistor Q4 and the base of the output transistor Q1, to the base of which the reference voltage V3 is applied and the emitter of which is connected to the collector of the transistor Q2, and a transistor Q8 the collector of which is grounded, the base of which is connected to an output VOUT and the emitter of which is connected to the emitter of the transistor Q7 and the collector of the transistor Q2. Note that a portion corresponding to the base current supply section 2 of FIG. 1 is a current mirror differential amplifier section constituted of the PNP transistors Q2 and Q3 and the NPN transistors Q4 and Q5.

In the first example, a current of the current source I1 is split into collector currents of the transistors Q2 and Q3 according to a voltage difference between an input signal VIN and a reference voltage V1. A collector current of the transistor Q2 (corresponding to a base current supplied to the output transistor Q1 from the base current supply section 2) is split into a collector current of the transistor Q7 and a collector current (a first control current) of the transistor Q8 according to a voltage difference between a voltage at the output VOUT and the reference voltage V3. Since the collectors of the transistors Q7 and Q4 are connected to each other, a difference between the collector currents is a base current of the output transistor Q1. Herein, a collector current of the transistor Q4 is a current obtained by mirroring a collector current of the transistor Q3 in a first current mirror circuit constituted of the transistors Q4 and Q5. Herein, part or all of a collector current of the transistor Q2 is a base current supplied to the output transistor Q1 from the base current supply section 2.

If a voltage at the output VOUT is sufficiently higher than the reference voltage V3, the transistor Q8 does not operate; therefore, a collector current of the transistor Q2 is equal to a collector current of the transistor Q7. On the other hand, when a voltage at the output VOUT takes a value in the vicinity of the reference voltage V3 because of falling in voltage at the output VOUT, the transistor Q8 is activated to start causing a current to flow; a collector current of the transistor Q7 decreases, in turn, a base current of the transistor Q1, which is a difference between collector currents of the transistors Q7 and Q4, also decreases and in company with the decrease, a collector current of the output transistor Q1 also decreases, therefore suppressing falling in voltage of the output VOUT. Since with more falling in voltage at the output VOUT, a current flowing into the transistor Q8 increases, a base current of the output transistor Q1 decreases, thereby suppressing falling in voltage at the output VOUT. When a voltage at the output VOUT falls down to a fixed value and is kept thereat, a base current and collector current of the transistor Q1 take the lowest necessary values.

Therefore, since a current is suppressed while a limiting action to limit falling in voltage at the output VOUT works, a base current of the output transistor Q1 can be set to a large value in order to ensure a sharp transition in voltage at the output VOUT, thereby enabling an output circuit capable of a high speed action with a low consumption current to be realized.

SECOND EXAMPLE

Figure 3:
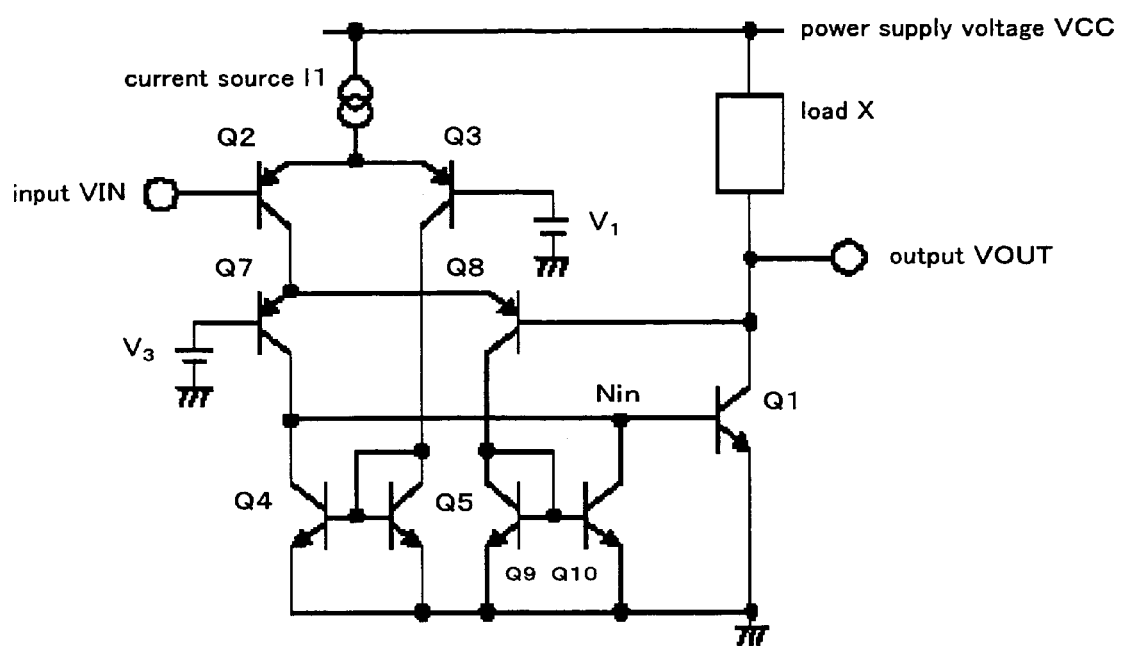
FIG. 3 is a circuit diagram showing a circuit configuration of a second example of the output circuit in accordance with the present invention.

In FIG. 3, there is shown the first embodiment of the circuit of the present invention shown in the block diagram of FIG. 1, as a circuit diagram of a second example realized with a concrete transistor circuit. The second example is different from the first example in that in the second example, the collector of a transistor Q8 is connected to an input terminal of a second current mirror circuit constituted of transistors Q9 and Q10 instead of grounding the collector of a transistor Q8 and an output terminal thereof is connected to the base of an output transistor Q1 and the collectors of transistors Q7 and Q4. That is, in the second example, a portion corresponding to the base current control section of FIG. 1 includes a comparator constituted of the transistors Q7 and Q8, and a second current mirror circuit constituted of the transistors Q9 and Q10. The portion corresponding to the base current supply section 2 and other parts of the circuit configuration of FIG. 1 is duplicated as the same as in the first example.

Herein, in the transistor Q9 as one of the transistors constituting of the second current mirror circuit, the collector and base thereof are connected to the collector of the transistor Q8 as an input to the current mirror circuit and the emitter thereof is grounded. In the transistor Q10, as the other transistor of the second current mirror circuit, the collector thereof is connected to the base of the output transistor Q1 and the collectors of the transistors Q4 and Q7 as an output of the current mirror circuit, and the base thereof is connected to the collector and base of the transistor Q9 and the collector of the transistor Q8 and the emitter thereof is grounded.

In the second example, a current of the current source I1 is split into collector currents of transistors Q2 and Q3 according to a voltage difference between the input voltage VIN and the reference and the reference voltage V1. A collector current of the transistor Q2 is further split into a collector current of the transistor Q7 and a collector current (a first control current) of the transistor Q8 according to a voltage difference between a voltage at the output VOUT (an inter-terminal voltage between the collector and emitter of the output transistor Q1) and the reference voltage V3. The above workings in the second example are the same as in the first example. Furthermore, a collector current (a second control current) of the transistor Q10 obtained by amplification of the first control current in an amplifier constituted of a second current mirror circuit is provided by further splitting a collector current of the transistor Q7.

As a result, a base current is extracted from the base of the transistor Q1 using the second control circuit obtained by amplifying the first control current flowing into the transistor Q8 when a voltage at the output VOUT takes a voltage in the vicinity of the reference voltage V3, thereby enabling a collector current of the output transistor Q1 to be reduced more efficiently than in the first example. Furthermore, if a base current of the output transistor Q1 is extracted after amplified at a larger mirror ratio in the second current mirror circuit, increase occurs in current amount extracted from the base of the output transistor Q1 when a voltage at the output OUT falls to a value lower than the reference voltage V3, thereby enabling falling in voltage at the output VOUT to be suppressed at a higher speed.

THIRD EXAMPLE

Figure 4:
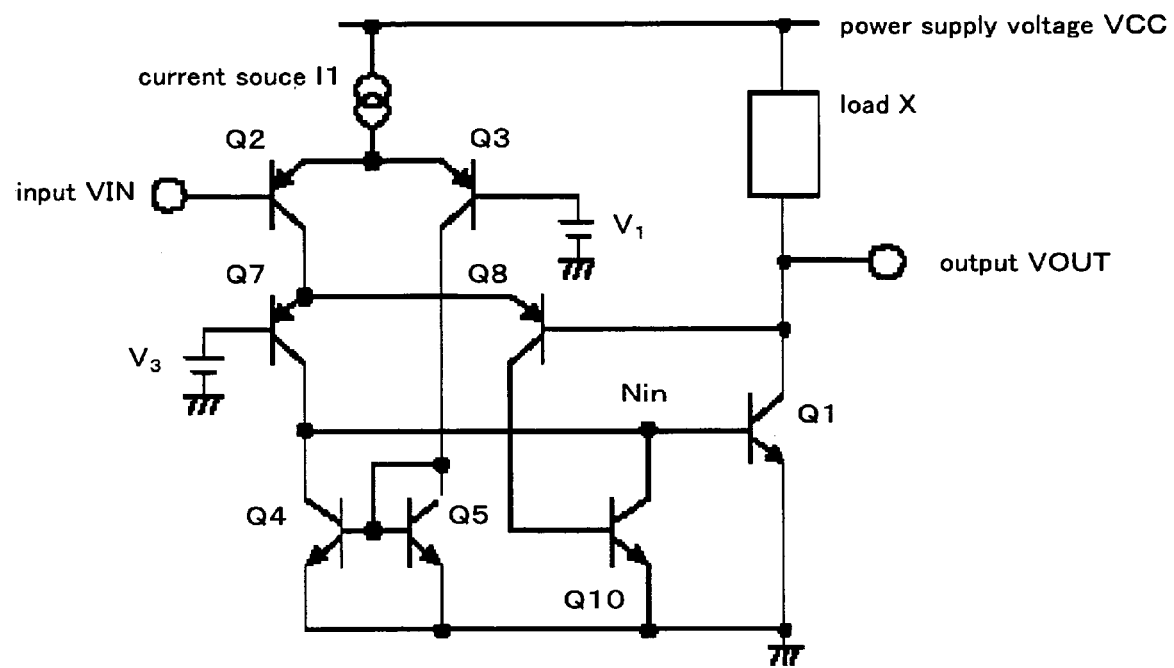
FIG. 4 is a circuit diagram showing a circuit configuration of a third example of the output circuit in accordance with the present invention.

In FIG. 4, there is shown the first embodiment of the circuit of the present invention shown in the block diagram of FIG. 1, as a circuit diagram of a third example realized with a concrete transistor circuit. In comparison with the second example, the third example is different from the second example in that a portion corresponding to the base current control section 1 is constituted of a comparator including transistors Q7 and Q8, and a transistor Q10; and a portion corresponding to the base current supply section 2 of FIG. 1 and other parts of the circuit configuration of FIG. 1 are duplicated as the same as in the first and second examples. That is, in the third example, an amplifier for amplifying a first control current flowing through the transistor Q8 is made not of a current mirror circuit but of the transistor Q10 alone. Furthermore, the third example is different from the first example in that the collector of the transistor Q8 is not grounded and the emitter thereof is grounded, and connected to the base of the transistor Q10 the collector of which is connected to the base of the output transistor Q1 and the collectors of the transistors Q4 and Q7.

In the third example, amplification of a collector current (a first control current) of the transistor Q8 which is performed in the current mirror amplifier in the second example is realized using an amplification action of the transistor Q10, thereby enabling amplification with a larger factor with ease. Therefore, a principle of the basic control action is the same as in the second example.

FOURTH EXAMPLE

Figure 5:
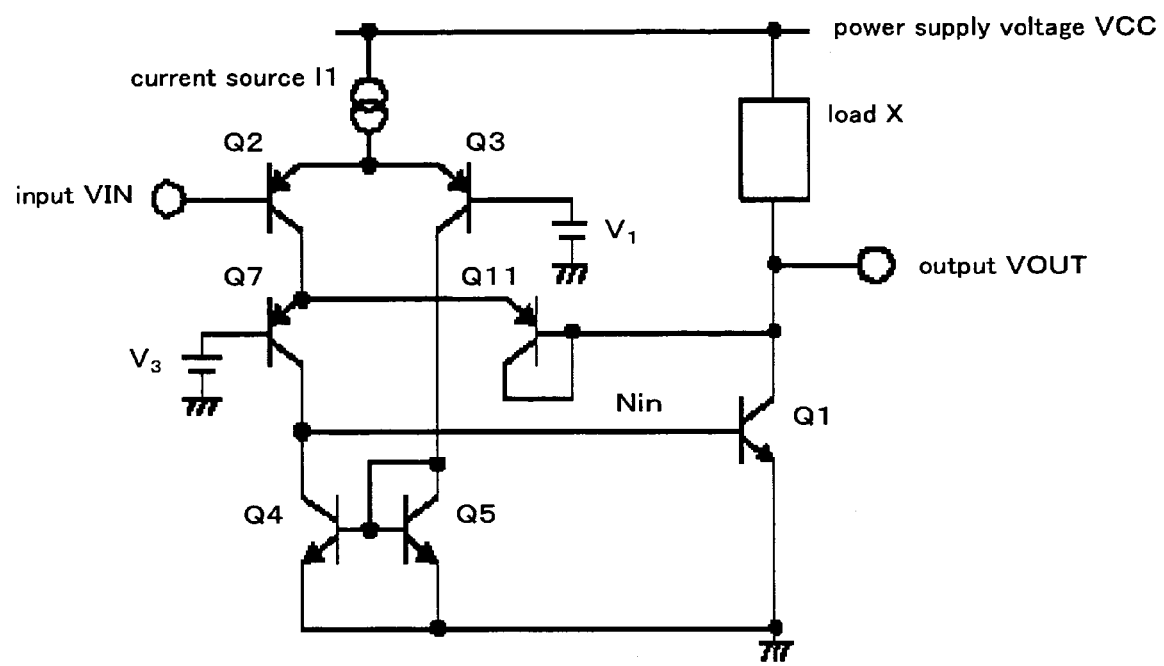
FIG. 5 is a circuit diagram showing a circuit configuration of a fourth example of the output circuit in accordance with the present invention.

In FIG. 5, there is shown the first embodiment of the circuit of the present invention shown in the block diagram of FIG. 1, as a circuit diagram of a fourth example realized with a concrete transistor circuit. The fourth example is different from the first example in that in the fourth example, the collector of a transistor Q11 (corresponding to the transistor Q8 of the first example) is connected to the collector of the output transistor Q1 instead of grounding the collector thereof. That is, in the fourth example, the output transistor Q1 is supplied, as a collector current thereof, with a collector current (a first control current) of the transistor Q11 obtained by splitting a base current (a collector current of the transistor Q2) supplied from a base current supply section 2 according to an inter-terminal voltage between the collector and emitter of the output transistor Q1.

In the fourth example, in a case where an impedance of a load X is high, in order that an output voltage at the output VOUT of the output transistor Q1 is limited so as not to be a value lower than the reference voltage V3, a collector current of the output transistor Q1 is required to be cut off or reduced to a state close to the cutting off, in the state of which an impedance of the output VOUT is unpreferably high.

Therefore, as in the circuit configuration shown in FIG. 5, a current (a first control current) flowing into the transistor Q11 is supplied to the collector of the output transistor Q1, whereby a collector current of the transistor Q11 flows into the collector of the output transistor Q11 even in a state where a limiting action to limit falling in voltage at the output VOUT works; therefore, enabling an output impedance to be reduced.

FIFTH EXAMPLE

Figure 6:
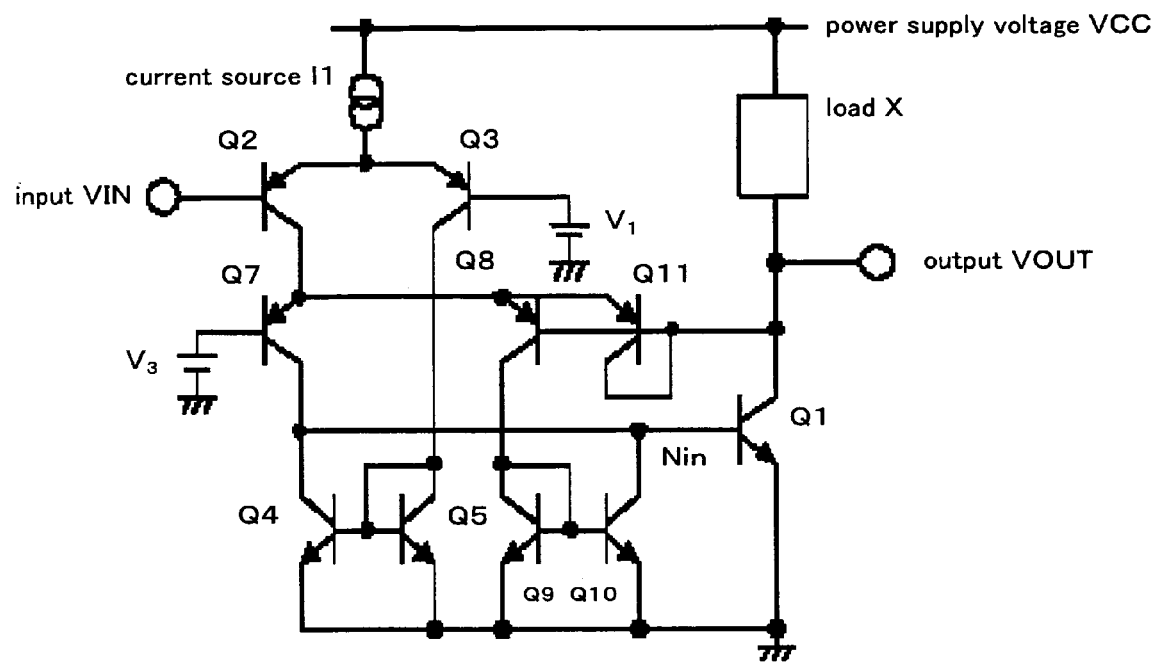
FIG. 6 is a circuit diagram showing a circuit configuration of a fifth example of the output circuit in accordance with the present invention.

In FIG. 6, there is shown the first embodiment of the circuit of the present invention shown in the block diagram of FIG. 1, as a circuit diagram of a fifth example realized with a concrete transistor circuit. The fifth example is, as shown in FIG. 6, a circuit configuration is a result of combination of the second example shown in FIG. 3 and the fourth example shown in FIG. 5. That is, a collector current of the transistor Q2 is split into a collector current of a transistor Q7, a collector current of a transistor Q8 and a collector current of a transistor Q11 according to a difference between a voltage at an output VOUT (an inter-terminal voltage between the collector and emitter of an output transistor Q1) and the reference voltage V3. Herein, a collector current of the transistor Q8 in the second example (a first control current) or a collector current of the transistor Q11 in the fourth example (a first control current) is the sum of collector currents of the transistors Q8 and Q11 in the fifth example.

In such a way, in the fifth example, the output circuit has both of the characteristics of the output circuits of the second and fourth examples, wherein a reduction in impedance of the output VOUT can be realized and a high speed limiting action can be realized, in a state where a limiting action to suppress falling in voltage at the output VOUT works when the load X is of a high impedance.

While in the first embodiment (including the first to fifth examples) of an output circuit in accordance with the present invention, description is given of cases where the output transistor Q1 is an NPN bipolar transistor, no problem occurs even if the output transistor Q1 is a PNP transistor instead. In the case, in the first to fifth examples, it is only required that in the transistors constituting the base current supply section 2 and the base current control section 1, a PNP transistor is replaced with an NPN transistor and vice versa, and a relationship in connection with the power supply voltage and the ground potential is switched therebetween in correspondence to the replacements.

Second Embodiment

Then, description will be given of a second embodiment of an output circuit in accordance with the present invention with reference to FIG. 7.

Figure 7:
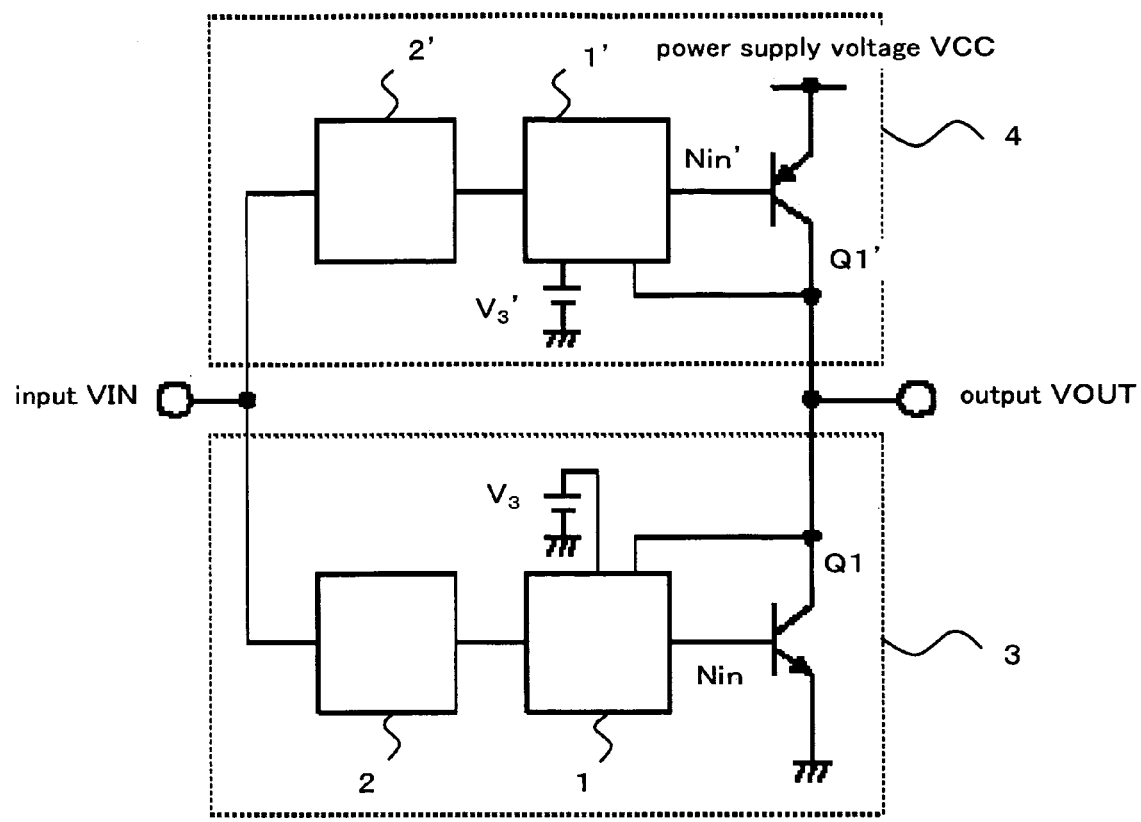
FIG. 7 is a block diagram showing a configuration of a second embodiment of an output circuit in accordance with the present invention.

As shown in FIG. 7, the output circuit in accordance with the second embodiment is constructed by synthesizing the two output circuits 3 and 4 with configurations in the first embodiment. Herein, in the output circuit 3, the output transistor Q1 is an NPN transistor and in the output circuit 4, the output transistor Q1' is a PNP transistor, wherein the collectors of the output transistors Q1 and Q1' are connected to a common output VOUT (an output node). The emitter of the output transistor Q1 is grounded, the emitter of the output transistor Q1' is connected to the power supply voltage VCC, which constitutes a so-called push-pull output driver. A common input signal VIN is used as an input signal to the output circuits 3 and 4. The output circuit 3 includes the NPN output transistor Q1, a first base current supply section 2 for supplying a base current to the NPN output transistor Q1 according to an input signal VIN from the outside, and a first base current control section 1 for detecting a first inter-terminal voltage between the collector and emitter of the NPN output transistor Q1 to control a base current supplied from the first base current supply section 2 so as not to cause the first inter-terminal voltage to fall to a value lower than a first predetermined voltage V3.

The output circuit 4 includes the PNP output transistor Q1', a second current supply section 2' for supplying a base current to the PNP output transistor Q1' according to an input signal VIN, and a second base current supply section 2' for detecting a second inter-terminal voltage between the collector and emitter of the PNP output transistor Q1' to control a base current supplied from the second base current supply section 2' so as not to cause the second inter-terminal voltage to fall to a value lower than a second predetermined voltage V3'.

To concrete circuit configurations of the output circuits 3 and 4, there can be applied the circuit configurations in the first to fifth examples shown in FIGS. 2 to 6. Note that as a circuit configuration of the output circuit 4, a circuit configuration has only to be used that is obtained by reversing a relationship between an NPN transistor and a PNP transistor and a relationship in connection with the power supply voltage VCC and the ground potential in the circuit configurations in the first to fifth examples shown in FIGS. 2 to 6.

In a circuit configuration in the second embodiment, an output can be realized that is capable of a high speed action with a low consumption current upon a rise and fall in voltage at the output VOUT. This can be applied to an output circuit such as a transistor-transistor logic circuit necessary for outputting binary data with high output rate.

According to the present invention, as described above, it is possible to limit a current supplied to the base of an output transistor so as not to be excessive when a limiting action for an output voltage works, thereby enabling an output circuit with a high speed and operable in low power consumption to be realized.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. An output circuit comprising:
   an output transistor an emitter of which is grounded, a base of which serves as an input node for a control current and a collector of which serves as an output node;
   a base current supply section for supplying a base current to the output transistor according to an input signal; and
   a base current control section for detecting an inter-terminal voltage between the collector and emitter of the output transistor to control a base current supplied from the base current supply section so as not to cause the inter-terminal voltage to fall to a value lower than a predetermined constant voltage, wherein the base current control section comprises a comparator having the inter-terminal voltage and the predetermined constant voltage as a differential input, and wherein the input signal separated from the predetermined constant voltage.

2. An output circuit according to claim 1, wherein
   the base current control section further comprises an amplifier which amplifies a first control current obtained by splitting the base current supplied from the base current supply section according to the inter-terminal voltage to generate a second control current and, by splitting the second control current from the base current, controls the base current supplied to the input node.

3. An output circuit according to claim 1, wherein the base current control section supplies a first control current obtained by splitting the base current supplied from the base current supply section according to the inter-terminal voltage to the output transistor as a collector current thereof to thereby control the base current supplied to the input node.

4. An output circuit according to claim 1, wherein the base current control section splits a first control current obtained by splitting the base current supplied from the base current supply section according to the inter-terminal voltage into at least two currents and one of the two currents is amplified by an amplifier to generate a second control current and, by splitting the second control current from the base current and supplying the other current to the output transistor as a collector current thereof, controls the base current supplied to the input node.

5. An output circuit according to claim 1, wherein the output transistor is an NPN transistor.

6. An output circuit according to claim 1, wherein the comparator is a PNP transistor.

7. An output circuit according to claim 2 or 4, wherein the amplifier is a current mirror circuit.

8. An output circuit according to claim 2 or 4, wherein the amplifier uses a current amplification action of a transistor.

9. An output circuit comprising:

an NPN output transistor an emitter of which is connected to a first power supply potential, a base of which serves as an input node for a control current, and a collector of which serves as an output node;

a PNP output transistor an emitter of which is connected to a second power supply potential, a base of which serves as an input node for a control current and a collector of which serves as an output node in common to the PNP output transistor and the NPN output transistor;

a first base current supply section for supplying a base current to the NPN output transistor according to an input signal;

a first base current control section for detecting a first inter-terminal voltage between the collector and emitter of the NPN output transistor to control a base current supplied from the first base current supply section so as not to cause the first inter-terminal voltage to fall to a value lower than a first predetermined constant voltage;

a second base current supply section for supplying a base current to the PNP output transistor according to the input signal; and a second base current control section for detecting a second inter-terminal voltage between the collector and emitter of the PNP output transistor to control a base current supplied from the second base current supply section so as not to cause the second inter-terminal voltage to fall to a value lower than a second predetermined constant voltage, wherein the first base current control section includes a comparator having the first inter-terminal voltage and the first predetermined constant voltage as a different input, and the second base current control section includes a comparator having the second inter-terminal voltage and the second predetermined constant voltage as a differential input.

* * * * *